(12) United States Patent
Van Antwerpen et al.

(10) Patent No.: US 7,587,688 B1
(45) Date of Patent: Sep. 8, 2009

(54) USER-DIRECTED TIMING-DRIVEN SYNTHESIS

(75) Inventors: Babette Van Antwerpen, Mountain View, CA (US); Jinyong Yuan, Cupertino, CA (US); David Karchmer, Los Altos, CA (US)

(73) Assignee: Altera Corporation, San Jose, CA (US)

( * ) Notice: Subject to any disclaimer, the term of this patent is extended or adjusted under 35 U.S.C. 154(b) by 172 days.

(21) Appl. No.: 11/510,206

(22) Filed: Aug. 24, 2006

(51) Int. Cl.
*G06F 17/20* (2006.01)
(52) U.S. Cl. .................... 716/3; 716/4; 716/5; 716/18; 703/13; 703/14
(58) Field of Classification Search .............. 716/1–5, 716/6, 18; 703/13, 14
See application file for complete search history.

(56) References Cited

U.S. PATENT DOCUMENTS

| | | | | |
|---|---|---|---|---|
| 5,880,971 | A * | 3/1999 | Dangelo et al. ............... | 716/6 |
| 5,960,184 | A * | 9/1999 | Cleereman et al. ............. | 716/3 |
| 6,668,364 | B2 * | 12/2003 | McElvain et al. .............. | 716/7 |
| 6,836,877 | B1 * | 12/2004 | Dupenloup .................. | 716/18 |
| 7,010,763 | B2 * | 3/2006 | Hathaway et al. ............... | 716/2 |
| 7,246,340 | B1 * | 7/2007 | Van Antwerpen et al. ..... | 716/18 |
| 2005/0039155 | A1 * | 2/2005 | New ........................... | 716/16 |

* cited by examiner

*Primary Examiner*—Jack Chiang
*Assistant Examiner*—Nghia M Doan
(74) *Attorney, Agent, or Firm*—Townsend and Townsend and Crew LLP

(57) ABSTRACT

Users or applications provide optimization information that specifies performance-critical portions of the design. Users can identify performance-critical portions of their designs from a priori evaluation of their design or by analyzing the results of previous compilations of their design or similar designs. An application may extract and analyze performance information from previous compilations of the design or similar designs to automatically specify the performance-critical portions of the design. The compilation software uses this specification to focus the appropriate types and amount of optimization on different portions of the design. The compilation software may use additional optimization techniques and/or may allocate additional computing resources to optimize the performance of performance-critical portions of the design. Other portions of the design that are not performance-critical may be optimized using balanced optimization techniques. Portions of the design may be designated as critical with respect to timing, area, power consumption or any other performance aspect.

26 Claims, 5 Drawing Sheets

USER-DIRECTED TIMING-DRIVEN SYNTHESIS

BACKGROUND OF THE INVENTION

The present invention relates to the field of programmable devices, and the systems and methods for programming the same. Programmable devices, such as FPGAs, typically include thousands of programmable logic cells that use combinations of logic gates and/or look-up tables to perform a logic operation. Programmable devices also include a number of functional blocks having specialized logic devices adapted to specific logic operations, such as adders, multiply and accumulate circuits, phase-locked loops, and one or more embedded memory array blocks. The logic cells and functional blocks are interconnected with a configurable switching circuit. The configurable switching circuit selectively routes connections between the logic cells and functional blocks. By configuring the combination of logic cells, functional blocks, and the switching circuit, a programmable device can be adapted to perform virtually any type of information processing function.

The process of determining the hardware configuration of a device that implements a user-specified design is referred to as compilation. Typical compilation processes begin with an extraction phase, followed by a logic synthesis and technology mapping phase, a clustering and placement phase, a routing phase, and an assembly phase. The logic synthesis phase converts a user design, typically expressed in terms of a register transfer level description, into a corresponding set of registers, logic gates, and other circuit components. For programmable device, a technology mapping phase, which is often considered part of logic synthesis, permutes the set of registers, logic gates, and other circuit components over the hardware architecture of a programmable device in order to match elements of the user design with corresponding portions of the programmable device.

A logic synthesis phase often converts a user design into many different equivalent sets of logic gates to determine an optimal set of logic gates implementing the user design. Logic synthesis may optimize the set of logic gates to meet different performance criteria, such as minimizing the area or device resources required, maximizing the operating speed of the design, or minimizing the power consumption of the design.

Timing-driven synthesis is one logic synthesis approach that utilizes timing information about the user design to determine a timing-optimal set of logic gates implementing the user design. In timing-driven synthesis, the timing information indicates which portions of the design are timing critical. The logic synthesis phase uses this timing information to create timing-optimized subsets of logic gates corresponding with the timing-critical portions of the user design, while optimizing logic gates corresponding with the non-timing-critical portions of the design for other performance criteria.

Unfortunately, it is often difficult to determine accurate timing information for a user design prior to the synthesis phase. The precise timing characteristics of a design are unknown until after the logic synthesis and subsequent compilation phases are complete. Timing estimation techniques may be used to estimate the timing characteristics of a design based on a given set of logic gates determined during the logic synthesis phase. However, the subsequent placement and routing phases of compilation greatly influence the final timing characteristics of the design. Therefore, timing estimation techniques based on the set of logic gates specified during logic synthesis are often very inaccurate. As a result, timing-driven synthesis often does not optimize designs as well as expected due to inaccurate timing information.

It is therefore desirable for a system and method to provide improved timing information for logic synthesis and technology mapping. It is also desirable for logic synthesis and technology mapping phases to provide improved optimization and require less compilation time by utilizing the improved timing information.

BRIEF SUMMARY OF THE INVENTION

An embodiment of the invention receives optimization information from users or other applications that specify performance-critical portions of the design. Users can identify performance-critical portions of their designs from a priori evaluation of their design or by analyzing the results of previous compilations of their design or similar designs. An application may extract and analyze performance information from previous compilations of the design or similar designs to automatically specify the performance-critical portions of the design.

Regardless of the source of the specification of performance-critical portions of the design, the compilation software uses this specification to focus the appropriate types and amount of optimization on different portions of the design. Performance-critical portions of the design may be subject to optimizations directed to solely improving their critical performance aspects, at the expense of decreasing their performance with respect to non-critical performance aspects. Using this specification, the compilation software may use additional optimization techniques and/or may allocate additional computing resources to optimize the performance of performance-critical portions of the design. Other portions of the design that are not performance-critical may be optimized using balanced optimization techniques.

BRIEF DESCRIPTION OF THE DRAWINGS

The invention will be described with reference to the drawings, in which.

DETAILED DESCRIPTION OF THE INVENTION

Although typical logic synthesis techniques have difficulty in estimating accurate timing information, designers can often easily identify performance-critical portions of their designs. Users can identify performance-critical portions of their designs from a priori evaluation of their design or by analyzing the results of previous compilations of their design or similar designs. In an embodiment, a designer or compilation software user specifies the performance-critical portions of their design. In another embodiment, the compilation software may extract and analyze performance information from previous compilations of the design or similar designs to automatically specify the performance-critical portions of the design. Regardless of the source of this specification of performance-critical portions of the design, the compilation software may use this specification to correctly optimize the design in the logic synthesis, technology mapping, and/or any other compilation phase where accurate estimates of the performance of the design are typically not available.

Figure 1:
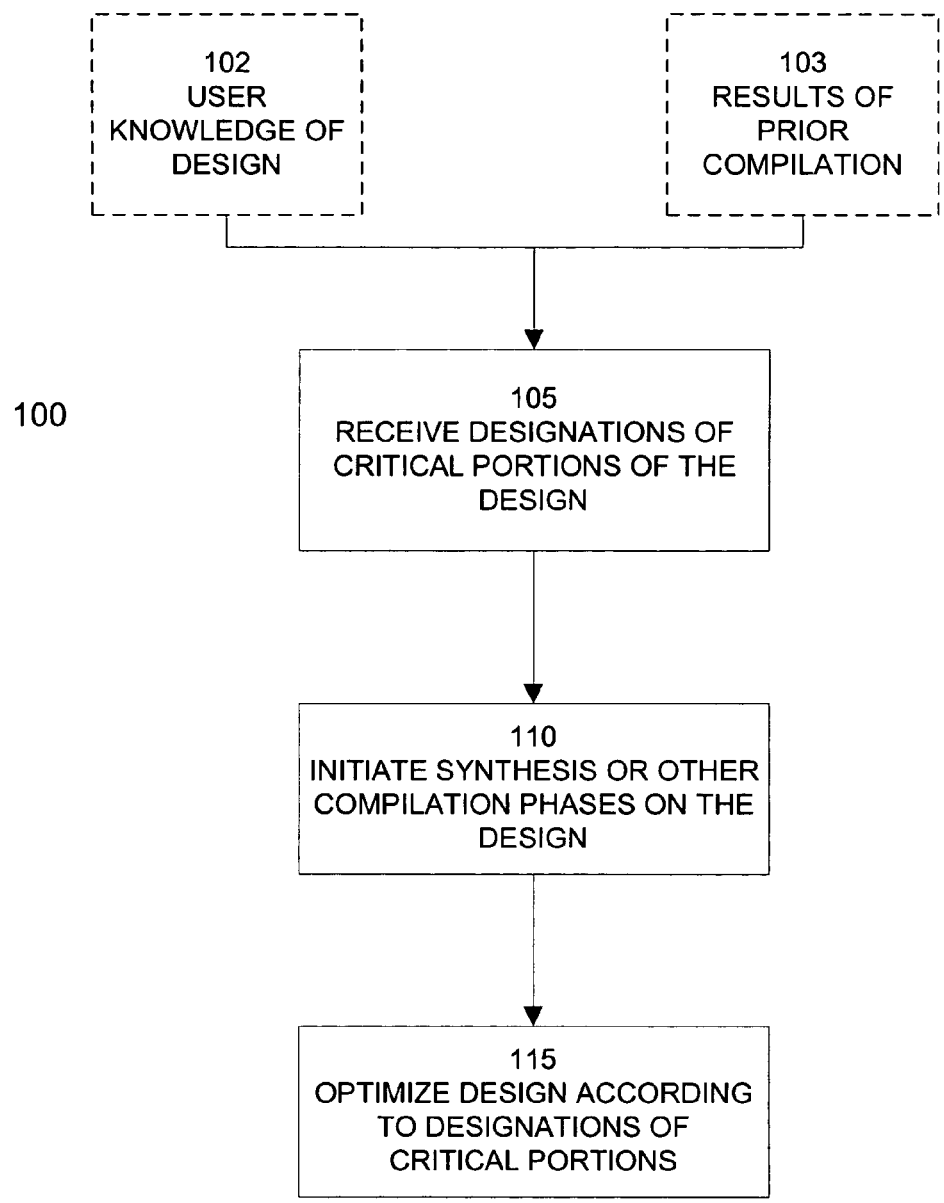
FIG. 1 illustrates a method of directing synthesis according to an embodiment of the invention.

FIG. 1 illustrates a method 100 of directing synthesis according to an embodiment of the invention. Step 105 receives designations of performance-critical portions of a design. Portions of a design may be designated as critical with respect to one or more aspects of the design's performance, such as timing, area or device resource consumption, or static and/or dynamic power consumption.

Step 105 receives the designation of performance-critical portions of the design from one or more sources. One source 102 is the knowledge of the designer and/or user of the compilation software. Another source 103 of designations of performance-critical portions of the design is the results of prior compilations of the design, previous versions of the design, and/or similar designs.

A user may manually designate portions of the design as critical with respect to one or more aspects of the design's performance. In an embodiment, the user provides a list of critical portions of the design to the compilation software. In another embodiment, the user includes the designation of critical portions of the design within the hardware description language source code specifying the design.

In another embodiment, a graphical user interface allows users to select critical portions of the design. In a further embodiment, this graphical user interface is integrated with a performance analysis software application, such that the user can view the performance of a previously compiled design and select critical portions of the design. For example, a timing analysis software application may display accurate estimates of timing information of a previous compilation of the design. The user may select timing-critical portions of the design using the graphical user interface of the timing analysis software, thereby designating these portions of the design for timing optimization during a subsequent recompilation of the design.

As discussed in detail below, in yet another embodiment, a program or script is used to extract and analyze performance information following the compilation of the design and automatically designate the worst-performing portions of the design as performance-critical for optimization during subsequent compilations.

Performance-critical portions of the design may be designated in a number of different ways. In an embodiment, a clock domain associated with a portion of the design may be specified as performance-critical. All of the components of the design associated with this clock domain, such as logic gates, registers, and other device components, will then be subject to performance optimizations during compilation. In an additional embodiment, a combination of two or more clock domains of the design may be designated as performance-critical. In this embodiment, any signal path between a register associated with the first clock domain and a register associated with the second clock domain will be treated as performance-critical. All of the components of the design associated with a performance-critical signal path will then be subject to performance optimizations during compilation.

In further embodiments, performance-critical portions of the design may designated by attributes other than their associated clock domains. For example, if a portion of a design, such as one or more registers, includes a clock enable signal on a critical path then an embodiment of the invention could designate these portions as performance-critical for subsequent compilations. Other portions of the design on the same clock domain but not associated with the critical clock domain will be optimized as normal. Similarly, embodiments can specify performance-critical portions of the design based on their association with super critical input and output pins and high fanout critical circuit nodes.

Following the receipt of the designation of one or more performance-critical portions of the design, step 110 initiates a logic synthesis or other compilation phase on the design. Step 110 can be carried out using any logic synthesis or compilation technique known in the art.

During or after the execution of the logic synthesis or other compilation phase initiated by step 110, step 115 optimizes the design according to the information received in step 105. In an embodiment, step 115 identifies all registers associated with a clock domain specified as performance-critical in step 105. Step 115 then identifies the signal paths and associated logic gates connected with the identified registers. These logic gates are referred to as critical gates.

Step 115 then applies any synthesis or other compilation phase optimization technique known in the art to maximize the performance of the critical gates with respect to their critical performance aspects. The remaining non-critical portions of the design may be processed and optimized to achieve good performance with respect to all pertinent performance aspects.

For example, if a user designates a clock domain of the design as timing-critical, an embodiment of step 115 may optimize the critical logic gates associated with this clock domain to maximize operating speed, disregarding other performance aspects such as area or power consumption. The remaining non-critical portions of the design will be optimized to achieve a balance between speed, area, power consumption, and/or any other performance criteria. If the optimization of critical logic gates is successful, the overall design will have balanced performance while the critical portions of the design will operate at the maximize possible speed, thereby ensuring that the overall design satisfies timing requirements.

In an embodiment, any synthesis or other compilation phase optimization technique known in the art may be used to maximize the performance of critical portions of the design. In another embodiment, the same optimization techniques are applied to both the critical and non-critical portions of the design. However, the synthesis or other compilation phase is configured to optimize the critical portions of the design more aggressively than other non-critical portions of the design. This may include devoting more computing time and resources to the optimization of critical portions of the design than to other portions of the design.

In a further embodiment, the logic synthesis or other compilation phase may apply different optimization techniques to critical portions of the design in addition to or instead of the optimization techniques applied to non-critical portions of the design. For example, an optimization technique may minimize the depth of signal paths in timing-critical portions of the design, assuming the other logic gates in the non-critical portions of the design are not timing-critical.

In another example, the logic synthesis phase may restructure buses of multiplexers so that each bus of multiplexers shares the same select logic, thereby optimizing for area. Alternatively, the multiplexers in a bus may retain separate select logic to optimize for speed.

In another example, in timing-critical portions of the design, the logic synthesis phase will flatten exclusive-or (XOR) gates to reduce the depth of signal paths, thereby increasing the operating speed of these portions of the design.

In further examples, additional optimization techniques may be applied to critical gates to perform factoring, extract cubes, or perform other optimizations. These optimization techniques can be performed during the synthesis or technology mapping phases or following these phases to more aggressively optimize critical portions of designs.

Figure 2:
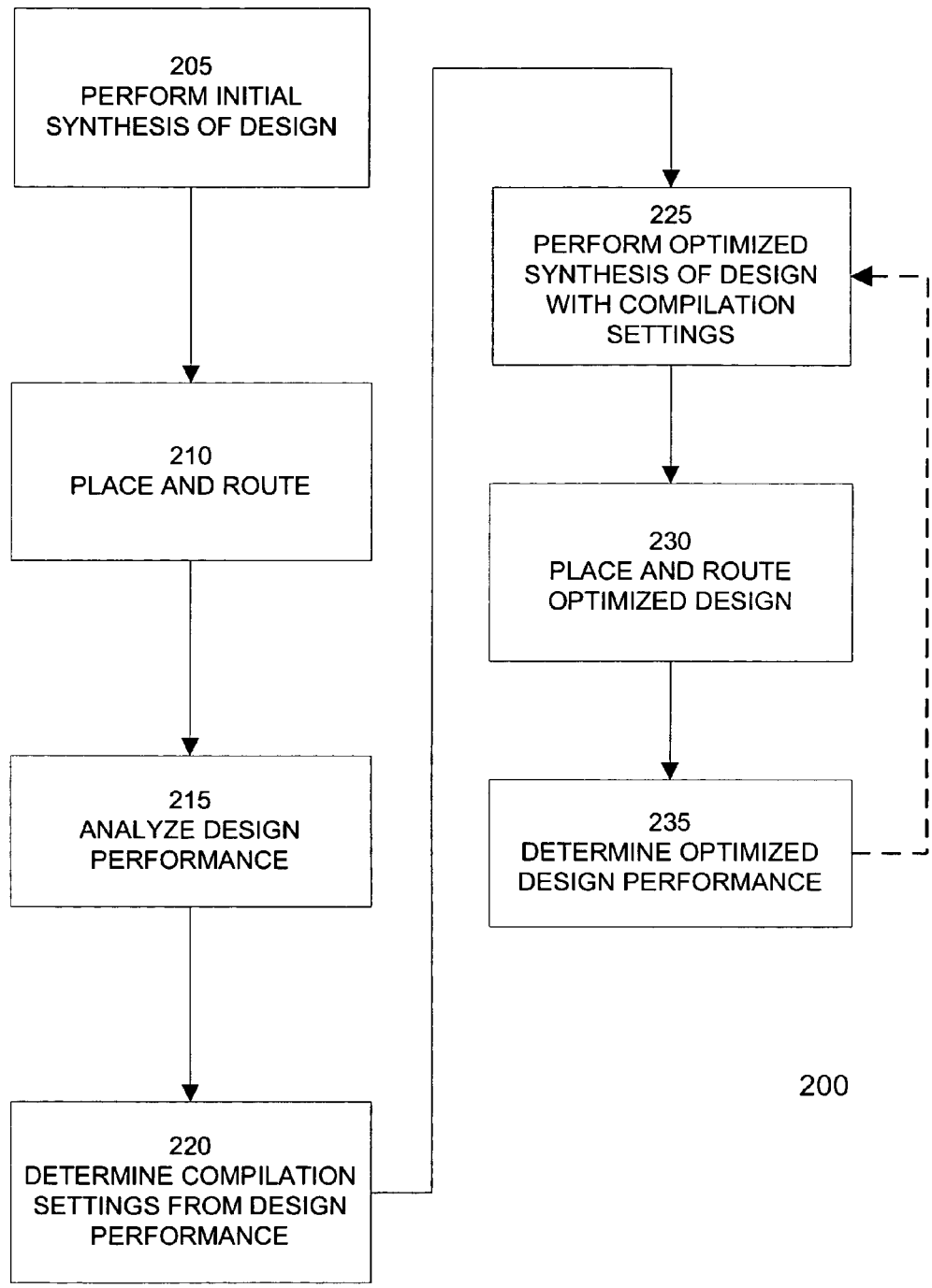
FIG. 2 illustrates a method of directing synthesis according to an embodiment of the invention.

FIG. 2 illustrates a method 200 of directing timing-driven synthesis according to an embodiment of the invention. In this embodiment, a script or program extracts and analyzes performance information from an initial compilation of the design to automatically designate performance-critical portions of the design for subsequent compilations.

Step 205 performs an initial synthesis of the design. Step 210 determines an initial placement and routing configuration of the design, using the results from step 205. In an embodiment, step 210 performs the same type of placement and routing typically performed for a normal compilation of the design. In another embodiment, step 210 performs an abbreviated placement and routing of the design that omits some placement and routing optimizations. This embodiment requires less time and computational resources to complete.

Step 215 analyzes the performance of the implementation of the design as determined by steps 205 and 210. Step 215 can analyze the performance of the implementation of the design with respect to one or more aspects of performance, including timing or speed, area or device resource consumption, and power consumption.

Step 215 may designate portions of the device as critical based on any type of criteria. For example, with respect to timing, if the device implementation determined in steps 205 and 210 does not satisfy the designer's timing requirements, step 215 may designate a set number of signal paths that are most timing-critical as timing critical.

In a further example, portions of the design having similar attributes to these timing-critical signal paths will be designated as timing critical. For example, step 215 may identify the 200 most critical signal paths of the design. Step 215 may designate the clock domains associated with these critical signal paths as timing critical, so that any signal path associated with these clock domains will be optimized accordingly during subsequent compilations.

Additional examples of similar attributes include signal paths for which there are critical paths from input pins to registers in this clock domain or for which there are critical paths from registers in this clock domain to output pins of the design. In an embodiment, step 215 designates clock domains with critical paths to or from a pin that do not meet timing as critical portions of the design. Similarly, step 215 may identify super-critical pins, which are input pins that are far from meeting timing requirements, and designate associated portions of the design as critical for subsequent compilations.

In another example, step 215 will identify all clock enables on registers that do not meet timing. Step 215 may designate these clock enable signals as timing-critical and direct subsequent compilations to replace these clock enable signals with equivalent logic.

In yet another example, step 215 may identify clock domains or other portions of the design that easily satisfy timing requirements by a large margin. Step 215 may designate these portions of the design as non-critical with respect to timing or as critical with respect to area. As a result, subsequent compilations of the design will optimize these portions of the design to minimize area, rather than speed or a balance of performance factors.

In another example, step 215 will identify register-to-register paths for which there is no placement that will meet timing because the path is too long. Step 215 will designate these paths and as timing-critical. In addition, step 215 will store the depth of each of these identified critical paths. During subsequent compilations, a logic synthesis phase will try to optimize these paths to have shorter depth.

In a further example, step 215 will identify shift registers that are implemented in RAM memory blocks and that are on a critical path. Step 215 will designate these shift registers as timing-critical. During subsequent compilations of the design, a logic synthesis phase will implement these shift registers using standard registers, which typically perform faster, instead of RAM, because this is faster in general.

In yet a further example, step 215 will identify registers with hold-time violations. During subsequent compilations of the design, a logic synthesis phase will try to shorten the clock path on one of the registers in order to improve on the hold-time problem.

In an example, step 215 will identify ROM memory blocks that are on the critical path. If these ROM memory blocks were inferred by the initial synthesis phase 205, step 215 will designate these ROM memory blocks are timing critical. During subsequent compilations of the design, a logic synthesis phase will not implement this functionality as ROM memory blocks.

In another example, step 215 will identify registers that have critical paths starting at the register, but no critical paths ending at the register. Step 215 will designate these registers as timing critical. During subsequent compilations of the design, a logic synthesis phase will try to apply retiming to these registers by moving them over their fanouts, such that their associated critical paths will be shorter and their associated non-critical paths will be longer. Step 215 can apply identify registers that have critical paths ending at the register and no critical paths starting at the register for similar optimizations during subsequent compilations.

In still another example, step 215 will identify nodes (registers, combinational nodes) with high fanout that are on a critical path. Step 215 will designate these nodes as timing critical. During subsequent compilations of the design, a logic synthesis phase will try to reduce the number of fanout of these nodes, by duplicating, or by not extracting duplicates.

Based on the analysis of step 215, step 220 determines compilation settings for the design. The compilation settings identifies critical portions of the design with respect to one or more performance characteristics. In an additional embodiment, the compilation settings also specify the types of optimizations to be applied to critical and non-critical portions of the design. In an embodiment, the compilation settings are saved in memory and/or in a file for use during subsequent compilations of the design. The compilation settings may be used to optimize the version of the design previously processed by steps 205, 210, 215, and 220. In a further embodiment, the compilation settings may be reused for modified versions of the design, provided the modifications do not substantially alter the design. As discussed in detail below, in this embodiment, steps 205, 210, 215, and 220 may be bypassed for modified versions of the design that reuse compilation settings previously determined.

Step 225 performs an optimized synthesis or other compilation phase of the design using the compilation settings. In an embodiment, step 225 can be carried out using any logic synthesis or other compilation phase technique known in the art. The techniques employed by step 225 may be the same or different from the synthesis techniques employed by step 205. Step 225 may optimize the design using any optimization technique known in the art, including but not limited to the optimization techniques discussed above. The optimizations performed by step 225 are directed at least in part by the compilation settings determined in step 220. Step 225 may also perform additional optimizations not specified by the compilation settings that are generally applicable to the design and do not contradict the compilation settings.

Step 230 performs placement and routing of the optimized synthesized design to determine a complete implementation of the design. Step 230 may use any placement and routing technique known in the art. Step 230 may further optimize the design.

Step 235 analyzes the performance of the complete implementation of the design with respect to one or more performance aspects, such as timing, area, and power consumption. In an embodiment, step 235 presents the results of this analysis to users, who may then accept or reject this implementation of the design.

If the implementation of the design is not satisfactory to the users, the design may be modified by users. In an embodiment, the modified design can then be reprocessed by steps 225, 230, and 235, reusing the compilation settings determined for a previous version of the design. In another embodiment, if the modified design is substantially different or the user desires more accurate optimizations, the entire method 200 may be repeated for the modified design.

Figure 3:
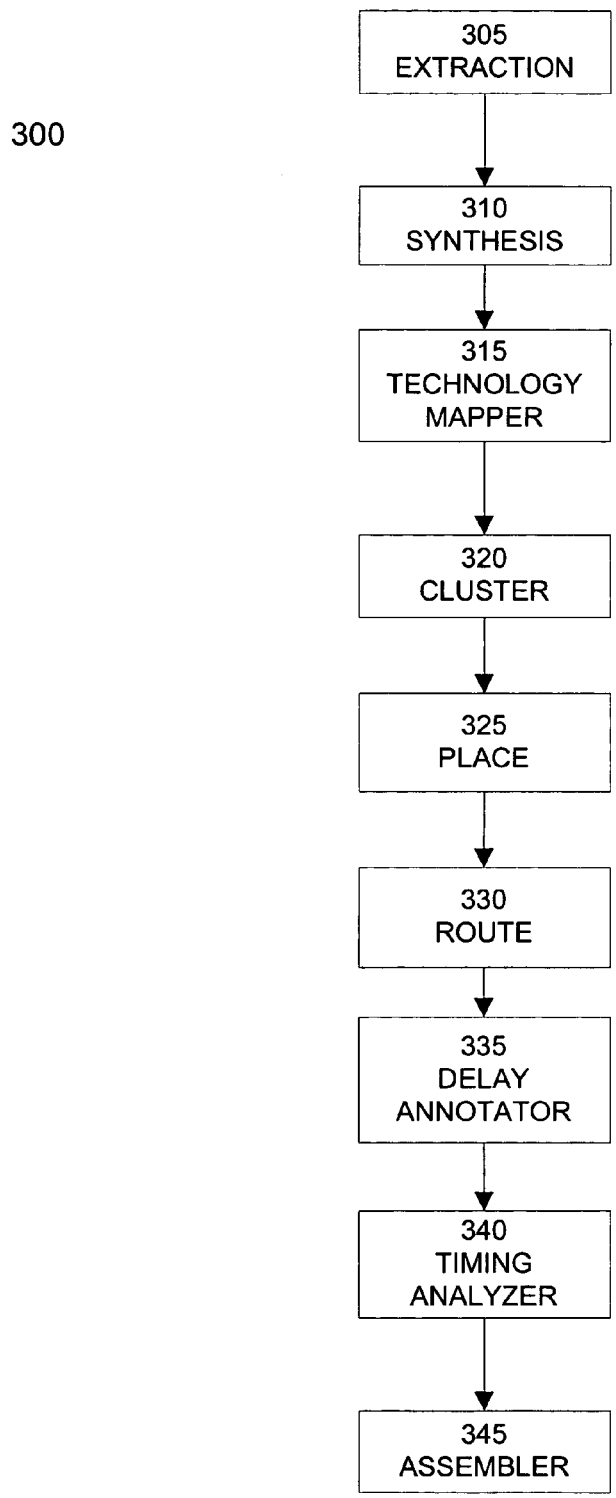
FIG. 3 illustrates an example compilation process suitable for use with an embodiment of the invention.

The above described embodiments can be used with compilation software for programmable device, structured ASICs, and general digital logic designs. FIG. 3 illustrates an example compilation process 300 suitable for use with an embodiment of the invention. The compilation process 300 converts a user design into a programmable device configuration adapted to configure a programmable device to implement the user design. The extraction phase 305 converts a description of the user design, expressed for example in a hardware description language, into a register transfer layer description.

Synthesis phase 310 converts the register transfer layer description of the user design into a set of logic gates. Technology mapping phase 315 subdivides the set of logic gates into a set of atoms, which are groups of logic gates matching the capabilities of the logic cells or other functional blocks of the programmable device. A given user design may be converted into any number of different sets of atoms, depending upon the underlying hardware of the programmable device used to implement the user design. For other types of devices, technology mapping phase 315 and the cluster phase 320, discussed below, may be omitted or replaced with other compilation phases specific to the type of device.

Following the technology mapping phase 315, the cluster phase 320 groups related atoms together into clusters. The placement phase 325 assigns clusters of atoms to locations on the programmable device. The route phase 330 determines the configuration of the configurable switching circuit of the programmable device used to connect the atoms implementing the user design.

The delay annotator phase 335 determines the signal delays for the set of atoms and their associated connections in the configurable switching circuit using a timing model of the programmable device. The timing analysis phase 340 determines the maximum operating speed of the programmable device when implementing the user design, for example by determining the portions of the user design have the largest signal delay.

The assembler phase 345 generates a set of configuration information specifying the configuration of the programmable device implementing the user design, including the configuration of each of the logic cells used to implement the user design and the configuration of the configurable switching circuit used to connect the logic cells. The assembler phase 345 can write the configuration information to a configuration file, which can then be used to configure one or more programmable devices to implement instances of the user design.

Figure 4:
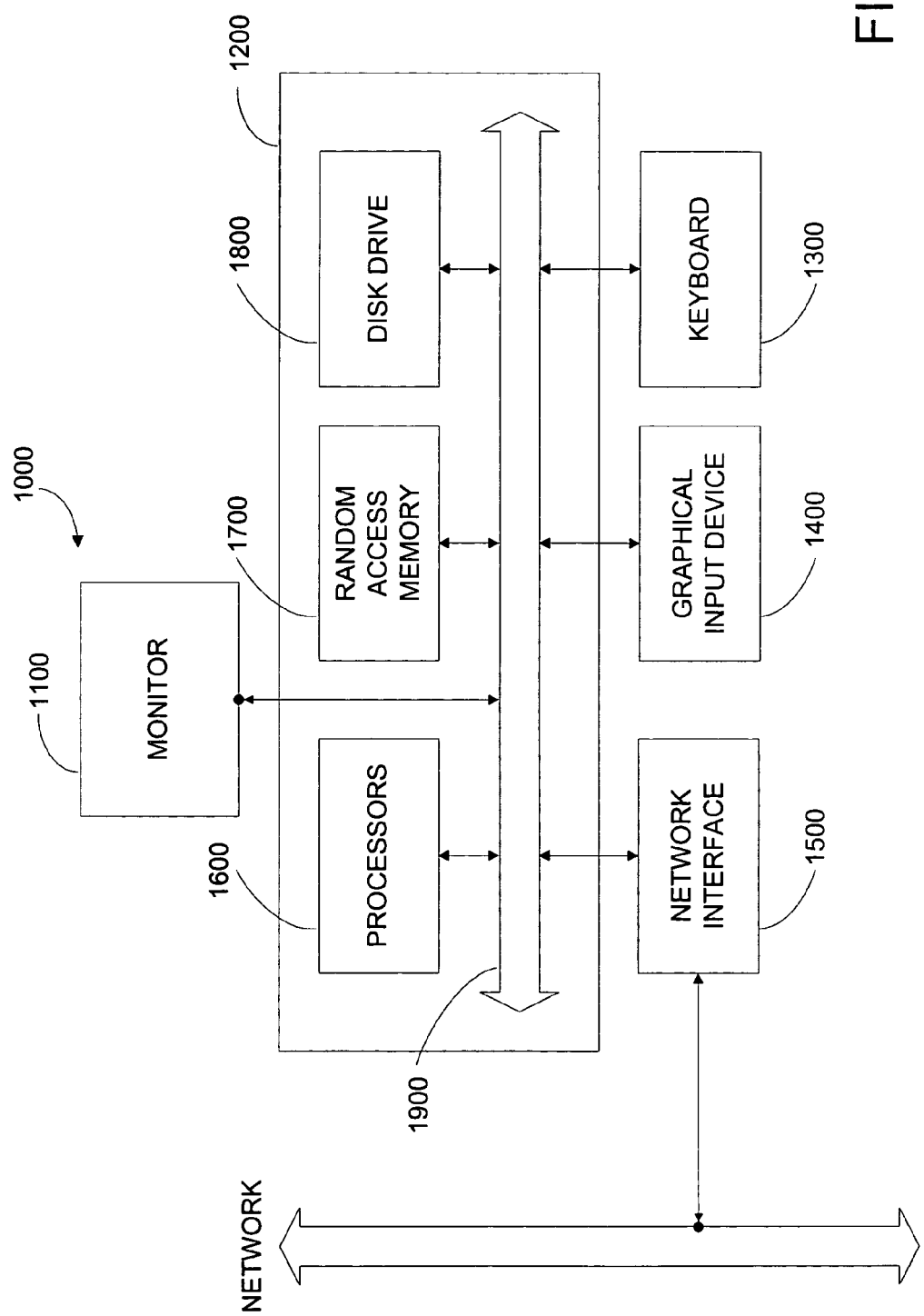
FIG. 4 illustrates a computer system suitable for implementing an embodiment of the invention.

FIG. 4 illustrates a computer system 1000 suitable for implementing an embodiment of the invention. Computer system 1000 typically includes a monitor 1100, computer 1200, a keyboard 1300, a user input device 1400, and a network interface 1500. User input device 1400 includes a computer mouse, a trackball, a track pad, graphics tablet, touch screen, and/or other wired or wireless input devices that allow a user to create or select graphics, objects, icons, and/or text appearing on the monitor 1100. Embodiments of network interface 1500 typically provides wired or wireless communication with an electronic communications network, such as a local area network, a wide area network, for example the Internet, and/or virtual networks, for example a virtual private network (VPN).

Computer 1200 typically includes components such as one or more general purpose processors 1600, and memory storage devices, such as a random access memory (RAM) 1700, disk drives 1800, and system bus 1900 interconnecting the above components. RAM 1700 and disk drive 1800 are examples of tangible media for storage of data, audio/video files, computer programs, applet interpreters or compilers, virtual machines, and embodiments of the herein described invention. Further embodiments of computer 1200 can include specialized input, output, and communications subsystems for configuring, operating, testing, and communicating with programmable devices. Other types of tangible media include floppy disks; removable hard disks; optical storage media such as DVD-ROM, CD-ROM, and bar codes; non-volatile memory devices such as flash memories; read-only-memories (ROMS); battery-backed volatile memories; and networked storage devices.

Figure 5:
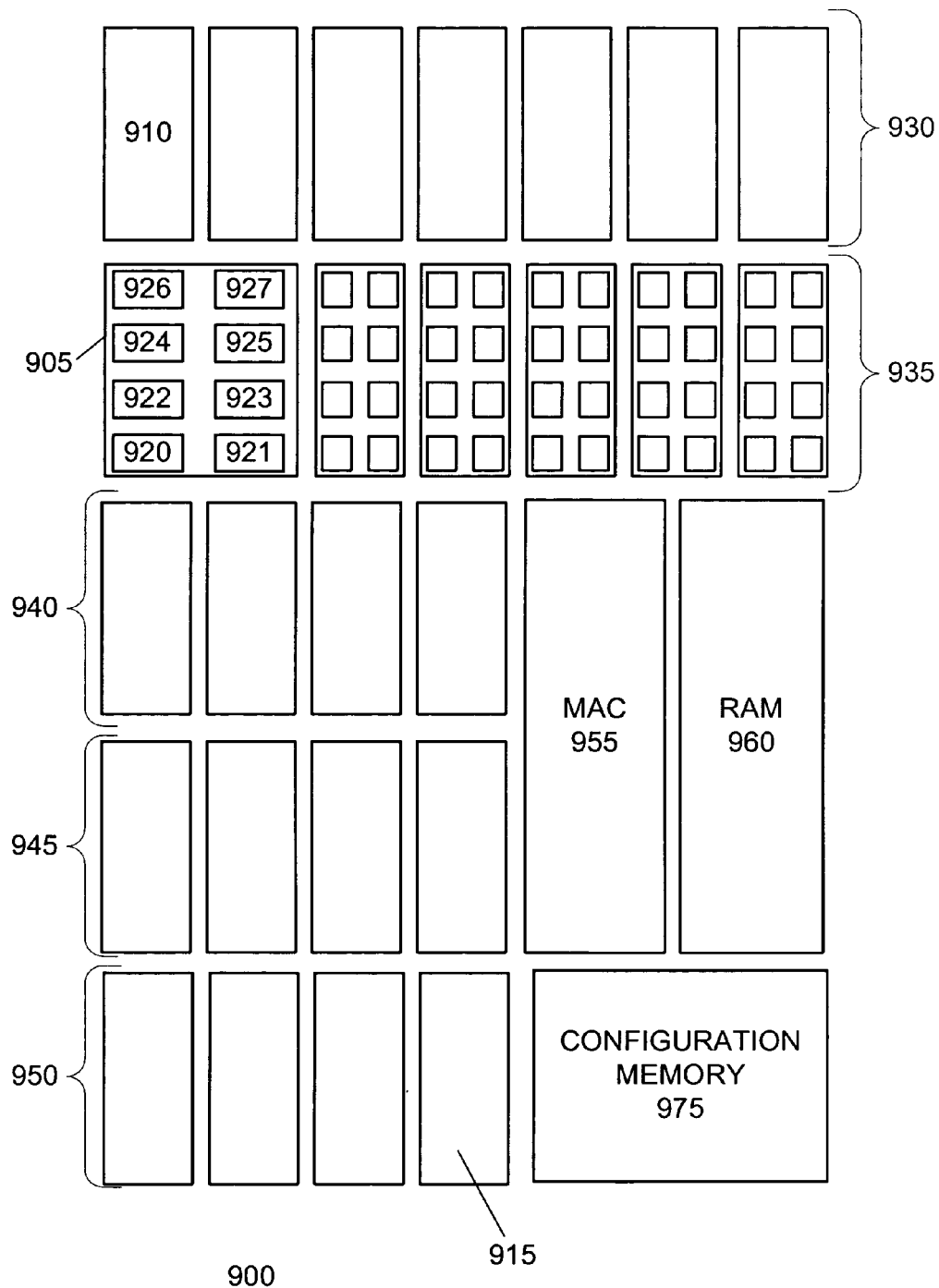
FIG. 5 illustrates a portion of an example programmable device suitable for use with an embodiment of the invention.

FIG. 5 illustrates a portion of an example programmable device 900 suitable for use with an embodiment of the invention. Programmable device 900 includes a number of logic array blocks (LABs), such as LABs 905, 910, 915. Each LAB includes a number of programmable logic cells using logic gates and/or look-up tables to perform a logic operation. LAB 905 illustrates in detail logic cells 920, 921, 922, 923, 924, 925, 926, and 927. Logic cells are omitted from other LABs in FIG. 5 for clarity. The LABs of device 900 are arranged into rows 930, 935, 940, 945, and 950.

In an embodiment, the arrangement of logic cells within a LAB and of LABs within rows provides a hierarchical system of configurable connections, in which connections between logic cells within a LAB, between cells in different LABs in the same row, and between cell in LABs in different rows require progressively more resources and operate less efficiently. In some programmable devices, such as field programmable gate arrays (FPGAs), the configurable connections are implemented with a configurable switching circuit capable of routing signals between any arbitrary portions of the programmable device in accordance with configuration data. The operation of the configurable switching circuit can be specified at any time by loading a programmable device configuration into the programmable device. In other programmable devices, such as structured ASICs, the configurable connections are specified during manufacturing according to the configuration data produced by a compilation process 300.

In addition to logic cells arranged in LABs, programmable device 900 also include specialized functional blocks, such as multiply and accumulate block (MAC) 955 and random access memory block (RAM) 960. For clarity, the portion of the programmable device 900 shown in FIG. 5 only includes a small number of logic cells, LABs, and functional blocks. Typical programmable devices will include thousands or tens of thousands of these elements.

Further embodiments can be envisioned to one of ordinary skill in the art after reading the attached documents. For example, although the invention has been discussed with reference to programmable devices, it is equally applicable to logic minimization applications used to design any type of digital device, such as standard or structured ASICs, gate arrays, general digital logic devices, as well as digital logic devices implemented with advanced process technologies such as silicon nanowires or carbon nanotubes. In other embodiments, combinations or sub-combinations of the above disclosed invention can be advantageously made. The block diagrams of the architecture and flow charts are grouped for ease of understanding. However it should be understood that combinations of blocks, additions of new blocks, re-arrangement of blocks, and the like are contemplated in alternative embodiments of the present invention.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A method of directing an optimization of a compilation process, wherein a compilation determines a configuration of a circuit to implement a user design, the method comprising:
   receiving, at a computer system, optimization information for a compilation, wherein the optimization information specifies at least one performance-critical portion of the user design, wherein the performance-critical portion of the user design includes logic gates, and wherein the optimization information is not based on results from a previous compilation of the user design, and wherein receiving optimization information includes receiving the optimization information from a user;
   determining, with the computer system, compilation settings for the design based at least in part on the optimization information,
      wherein the compilation settings specify a first optimization to be applied to the performance-critical portion of the design and a second optimization to be applied at least to a remaining portion of the design;
   initiating a compilation of the design, wherein the compilation includes at least one compilation phase responsive to the compilation settings; and
   performing, with the computer system, the first and second optimizations as part of the at least one compilation phase;
   based on at least one result of the performed optimized compilation, obtaining a configuration of the circuit that implements the user design, wherein the configuration includes placing and routing the user design on the circuit.

2. The method of claim 1, wherein the compilation phase is a logic synthesis phase.

3. The method of claim 1, wherein the compilation phase is a technology mapping phase.

4. The method of claim 1, wherein the optimization information identifies the performance-critical portion of the design by at least one associated clock domain.

5. The method of claim 1, wherein the optimization information identifies the performance-critical portion of the design by at least one associated input or output pin.

6. The method of claim 5, wherein the associated input or output pin is a super-critical pin.

7. The method of claim 1, wherein the optimization information identifies the performance-critical portion of the design by at least one associated clock enable signal.

8. The method of claim 1, wherein the optimization information identifies the non-performance-critical portion of the design.

9. The method of claim 1, wherein the optimization information identifies the performance-critical portion of the design by at least one associated register.

10. The method of claim 9, wherein the associated register is connected with a critical path.

11. The method of claim 9, wherein the associated register is a shift register implemented in a RAM memory block.

12. The method of claim 9, wherein the associated register has a hold-violation for at least one connected signal path.

13. The method of claim 1, wherein the optimization information identifies the performance-critical portion of the design including a ROM memory block.

14. The method of claim 1, wherein the optimization information identifies the performance-critical portion of the design including a high-fanout node on a critical path.

15. The method of claim 1, wherein the first optimization applies a first optimization technique with first parameters and the second optimization applies the first optimization technique with second parameters.

16. The method of claim 1, wherein the first optimization is associated with a first optimization technique and the second optimization is associated with a second optimization technique different from the first optimization technique.

17. The method of claim 16, wherein the first optimization technique is configured to maximize performance of the performance-critical portion of the design with respect to a performance aspect associated with the performance-critical portion, and wherein the second optimization technique is configured to balance performance with respect to a plurality of performance aspects associated with the design.

18. The method of claim 1, wherein the performance-critical portion of the design is timing-critical.

19. The method of claim 1, wherein the performance-critical portion of the design is area-critical.

20. The method of claim 1, wherein the performance-critical portion of the design is power-consumption-critical.

21. The method of claim 1, wherein receiving optimization information for a design includes receiving other optimization information from an optimization program.

22. The method of claim 1, wherein the optimization information is received from a user through a graphical user interface that allows the user to select portions of the design as being performance-critical.

23. The method of claim 1, wherein the first optimization is configured to maximize performance of the performance-critical portion of the design with respect to a performance aspect of performance-critical portion, and wherein the second optimization is configured to optimize performance of the remaining portion with respect to a plurality of performance aspects of the remaining portion.

24. A computer readable medium encoded with a plurality of instructions for controlling a computing system to perform an operation for directing the optimization of a compilation process, wherein a compilation determines a configuration of a circuit to implement a user design, the instructions comprising:
   receiving, at a computer system, optimization information for a compilation, wherein the optimization information specifies at least one performance-critical portion of the user design, wherein the performance-critical portion of the user design includes logic gates, and wherein the optimization information is not based on results from a previous compilation of the user design, and wherein receiving optimization information includes receiving the optimization information from a user;

determining compilation settings for the design based at least in part on the optimization information, wherein the compilation settings specify a first optimization to be applied to the performance-critical portion of the design and a second optimization to be applied at least to a remaining portion of the design;

initiating a compilation of the design, wherein the compilation includes at least one compilation phase responsive to the compilation settings; and performing the first and second optimizations as part of the at least one compilation phase;

based on at least one result of the performed optimized compilation, obtaining a configuration of the circuit that implements the user design, wherein the configuration includes placing and routing the user design on the circuit.

25. The computer readable medium of claim 24, wherein the optimization information identifies the performance-critical portion of the design by at least one associated clock domain.

26. The computer readable medium of claim 24, wherein the optimization information identifies the performance-critical portion of the design by at least one associated input or output pin.

* * * * *